United States Patent [19]
Nakagome et al.

[11] Patent Number: 4,484,144
[45] Date of Patent: Nov. 20, 1984

[54] SEMICONDUCTOR LIGHT AMPLIFIER

[75] Inventors: Yukio Nakagome; Kitsutaro Amano, both of Yokohama; Takaya Yamamoto, Niza, all of Japan

[73] Assignee: Kokusai Denshin Denwq Kabushiki Kaisha, Tokyo, Japan

[21] Appl. No.: 279,310

[22] Filed: Jul. 1, 1981

Related U.S. Application Data

[63] Continuation-in-part of Ser. No. 086,465, Oct. 17, 1979, abandoned.

[30] Foreign Application Priority Data

Oct. 19, 1978 [JP] Japan ................................. 53-127805

[51] Int. Cl.³ .......................... H01S 3/10; H04B 9/00
[52] U.S. Cl. ..................................... 330/4.3; 330/4.9; 370/4; 455/609; 455/610
[58] Field of Search ..................... 330/4.3, 4.9; 370/4; 455/601, 610, 612, 609; 372/25, 30

[56] References Cited

U.S. PATENT DOCUMENTS

| | | | |
|---|---|---|---|
| 3,319,080 | 5/1967 | Cornely et al. | 455/601 |
| 3,641,459 | 2/1972 | Paoli et al. | 372/30 |
| 3,801,819 | 4/1974 | Ohnsorge | 455/610 |
| 3,863,063 | 1/1975 | Indig et al. | 455/610 |
| 3,887,876 | 6/1975 | Zeidler | 330/4.3 |
| 4,019,048 | 4/1977 | Maione et al. | 455/601 |
| 4,038,610 | 7/1977 | Nishizawa et al. | 372/50 |
| 4,065,729 | 12/1977 | Gaver et al. | 372/50 |
| 4,181,901 | 1/1980 | Heyhe | 372/25 |
| 4,287,606 | 9/1981 | Lutes et al. | 455/610 |
| 4,292,512 | 9/1981 | Miller et al. | 455/612 |

OTHER PUBLICATIONS

Grabe et al., "Signal . . . Fibre Transmission Systems", 3/28/80, pp. 288–290, Eurocan 80, Germany.

Primary Examiner—Nelson Moskowitz
Attorney, Agent, or Firm—Robert E. Burns; Emmanuel J. Lobato; Bruce L. Adams

[57] ABSTRACT

A semiconductor light amplifier having an active layer performing a light amplification function, in which the light amplification is performed intermittently by a stable clock timing synchronized with the clock timing of an input light pulse train to the active layer.

5 Claims, 8 Drawing Figures

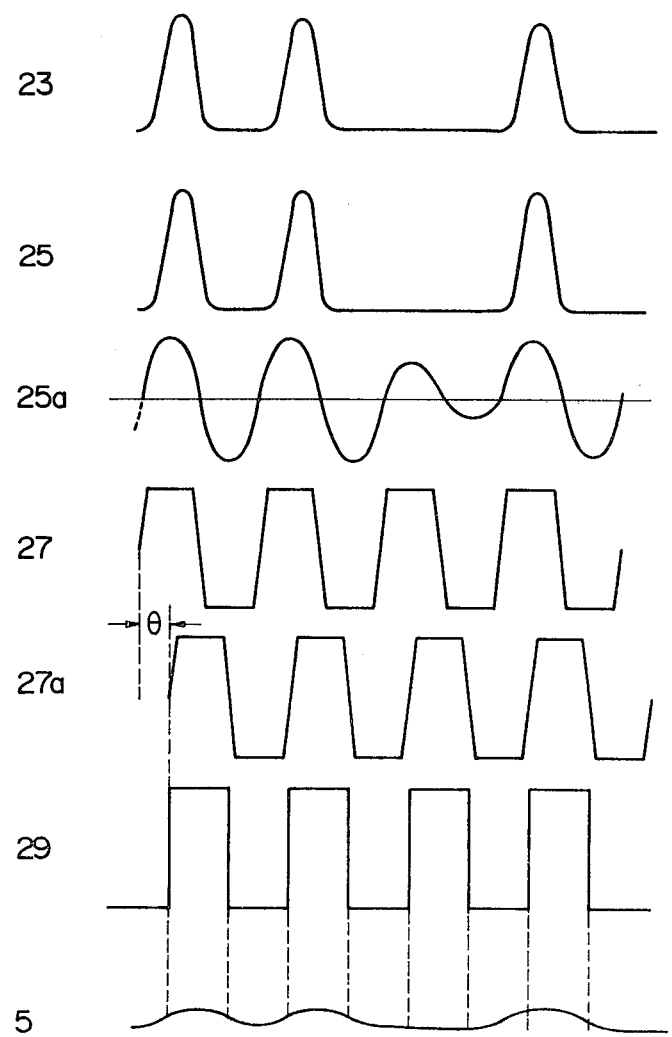

SEMICONDUCTOR LIGHT AMPLIFIER

CROSS-REFERENCE TO RELATED APPLICATION

This application is a continuation-in-part of our co-pending application, Ser. No. 86,465, filed on Oct. 17, 1979 and now abandoned.

BACKGROUND OF THE INVENTION

This invention relates to a semiconductor light amplifier having an active layer performing light amplification.

A light pulse train having propagated in the optical fiber has jitter, and if the light pulse train is optically amplified as it is, the jitter is also accumulated in the case of multiple repeating system, incurring degradation of the code error rate.

SUMMARY OF THE INVENTION

To overcome the abovesaid defects of the prior art, an object of the present invention is to provide a semiconductor light amplifier which is adapted to be driven by current pulses of a stable clock frequency synchronized with the timing of a light pulse train of an input signal.

BRIEF DESCRIPTION OF THE DRAWINGS

The present invention will hereinafter described in comparison with prior arts with reference to the accompanying drawings, in which:

FIG. 7 shows time charts explanatory of the operation of the examples shown in FIG. 5.

DESCRIPTION OF THE PREFERRED EMBODIMENTS

To make a difference between this invention and prior arts clear, conventional light amplifiers will first be described.

Figure 1:
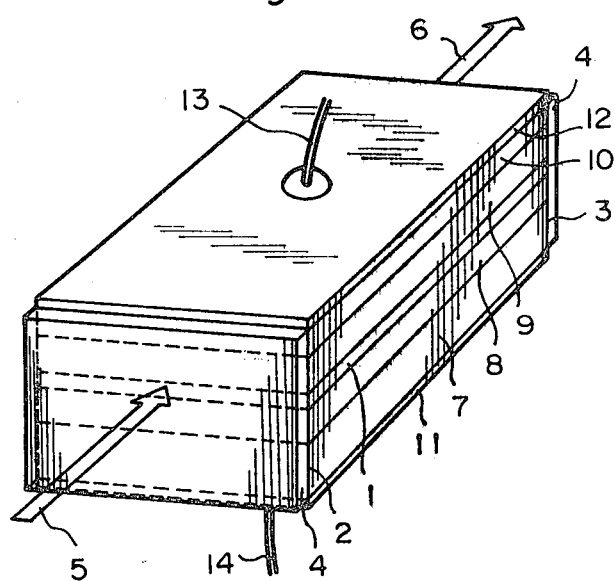
FIG. 1 is a diagrammatic showing of the construction of a conventional semiconductor amplifier using a semiconductor laser.

A typical example of conventional semiconductor light amplifiers using a semiconductor laser is shown in FIG. 1. The amplifier depicted in FIG. 1 is entirely identical in construction with an ordinary semiconductor laser; but, in order to prevent laser oscillation by spontaneous emission light in the active layer performing the light amplification function, it has an antireflection coating 3 as of $SiO_2$ deposited by evaporation on each of a pair of opposing end faces 2 and 3 forming an optical resonator and is adapted so that a light input signal 5 to the one end face 2 enters an active optical guide 1 to derive an amplified light output signal 6 from the other end face 3.

The example of FIG. 1 will be described in more detail in connection with a GaAs/AlGaAs double hereto structure laser. This structure has an n-type $Al_x Ga_{1-x}As$ clad layer 8, a GaAs active layer 1, a p—type $Al_xGa_{1-x}As$ clad layer 9 and a p—type GaAs layer 10 which are sequentially grown on an n-type GaAs substrate 7, by means of liquid phase opitaxial growth or the like. The clad layers 8 and 9 are provided for confining in the active layer 1 carriers, i.e. holes or electrons, and for light scattering in the direction of thickness of the active layer, and the composition ratio x of $Al_x Ga_{1-x}As$ is about 0.3. On the top and bottom surfaces of the element, ohmic electrodes 11 and 12 are respectively formed; and when flowing a current via leads 13 and 14 in the forward direction, the element acts as a light amplifier having a gain depending on the magnitude of the current.

Figure 2A:
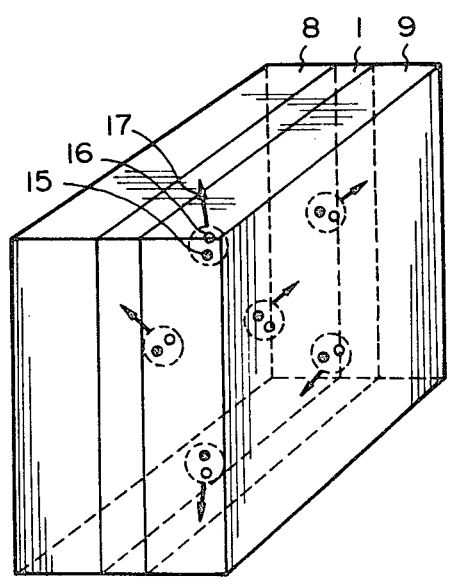
FIGS. 2A and 2B are diagrams explanatory of a simple principle of a light amplifier in connection with cases where an amplifying action takes place and where the amplifying action does not take place.
Figure 2B:
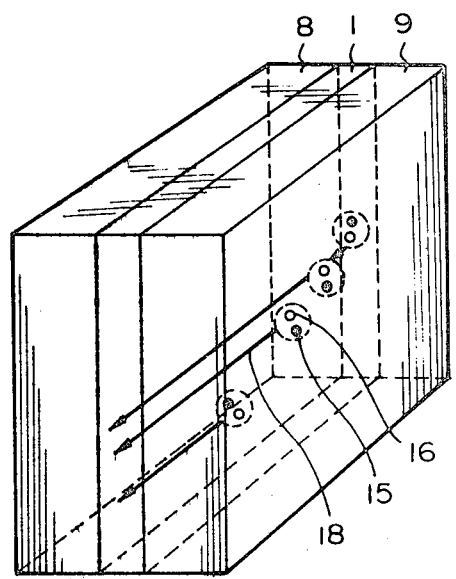

Referring now to FIGS. 2A and 2B, the principle of light amplification will be described in brief. When flowing a current in the forward direction, electrons 15 (black circles in FIGS. 2A and 2B) and holes 16 (white circles in FIGS. 2A and 2B) are injected from the n-type $Al_xGa_{1-x}As$ clad layer 9 into the active layer 1, wherein the electrons 15 and the holes 16 are recombined with each other, emitting light individually (spontaneous emission light 17). As shown in FIG. 2A, the light is emitted in all directions. Increasing the current being flowed, an induced emission starts to occur, as depicted in FIG. 2B. The induced emission, identified by 18, is such as follows; namely, an excited electron-hole pair is recombined to emit light, and the light strikes another electron-hole pair, which is also recombined by the stimulus to emit light. The induced light 18 advances in the same phase and in the same direction as the stimulus light, and by successive occurrence of this action, optical amplification is ob- tained.

Figure 3:
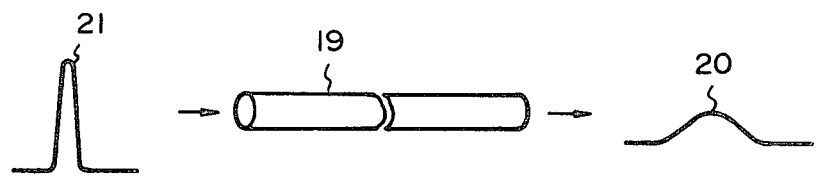
FIG. 3 schematically shows waveform diagrams explanatory of transmitted light pulse waveform and a received light pulse waveform having propagated in a long-distance optical fiber and a transmission line.

As shown in FIG. 3, a light pulse 20 which has propagated in a long-distance optical fiber transmission line 19 attenuated and has a relatively long pulse width, as compared with a transmitted light pulse. If being amplified as it is by a semiconductor light amplifier, the received light pulse 20 is optically amplified under the widened pulse width. In a case of a multiple repeating system, the pulse width becomes increasingly wide for each repeating, resulting in the transmission speed being materially lowered.

The present invention will hereinafter be described in detail.

Figure 4:
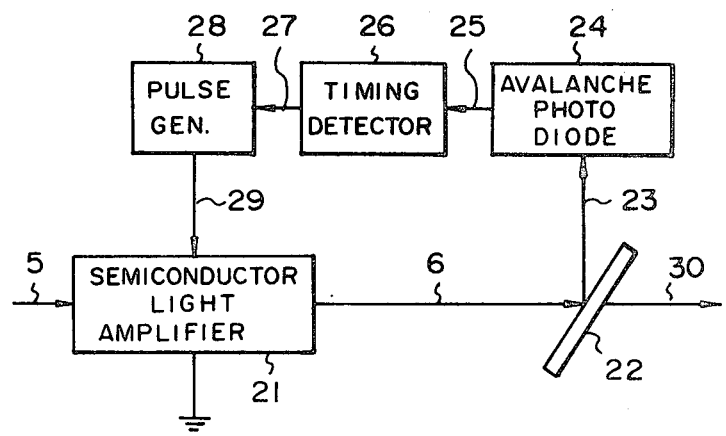
FIG. 4 is a block diagram showing an embodiment of this invention.

FIG. 4 illustrates an embodiment of this invention. The light input signal 5 incident to such a semiconductor light amplifier 21 as shown in FIG. 1 is directly amplified to provide the light output signal 6. A part 23 of the light output signal is branched by a half-mirror 22 and converted by an avalanche photo diode 24 into an electric signal 25, which is applied to a timing detector 26 to generate a timing signal 27. On the basis of this timing signal 27, drive current pulses 29 are produced by a pulse generator 28, such as a blocking oscillator or a multivibrator, and applied to the semiconductor light amplifier 21. In this case, it is desired that for example, the pulse generator 28 has the function of a delay circuit or the like, such as an integrator, which is capable of stably adjusting the timing of pulse generation.

With such an arrangement, the drive current pulses 29 are synchronized with the stable clock timing of the light input signal 5, and by driving the semiconductor light amplifier 21 with the drive current pulses 29 of a stable clock frequency, the amplifier 21 intermittently performs the light amplification of the light input signal 5 with that stable clock timing.

Figure 5:
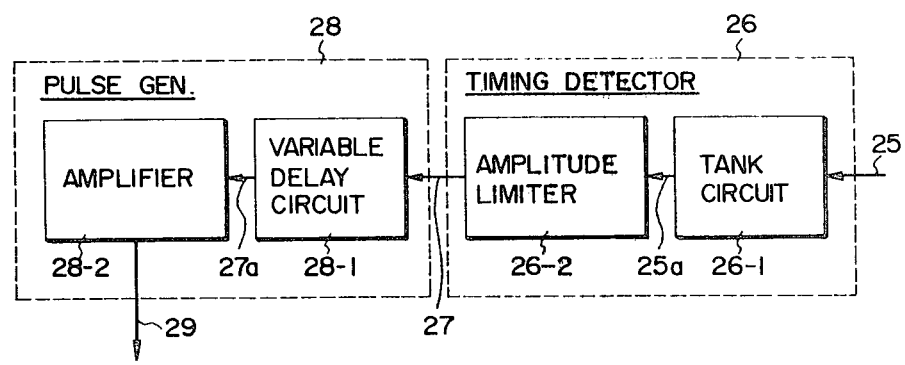
FIG. 5 is a block diagram illustrating examples of a timing detector on a pulse generator employed in the embodiment shown in FIG. 4.

With reference to FIG. 5, an example of the timing detector 26 comprises a tank circuit 26-1 receiving the electric signal 25 and an amplitude limiter 26-2 connected to the tank circuit 26-2. An example of the pulse generator 28 comprises a variable delay circuit 28-1 receiving the timing signal 27 from the timing detector 26, and an amplifier 28-2, which receives the output 27a of the variable delay circuit 28-1 to provide the drive current pulses 29.

Figure 6:
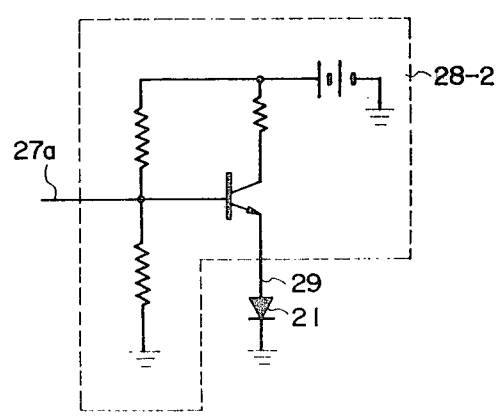
FIG. 6 is a circuit diagram illustrating an ecample of an amplifier employed in the examples shown in FIG. 5.

An example of the amplifier 28-2 is illustrated in FIG. 6.

With reference to FIGS. 4, 5, 6 and 7, the light signal 23 branched by the half-mirror 22 from the light signal 6 is converted by the avalanche photo diode 24 into the electric signal 25, which is applied to the tank circuit 26-1. This tank circuit is formed so as to tune with the repetition frequency of the electric signal 25, which is equal to that of the light signal 6 obtained from the input light signal 5, so that a sine wave 25a including damped parts but having a stable repetition frequency equal to the repetition frequency is applied to the amplitude limiter 26-2. An amplitude-limited timing signal 27 is provided from the amplitude limiter 26-2 and applied to the variable delay circuit 28-1 having a variable delay $\theta$. This variable delay $\theta$ is adjustable in a manual continuous manner or a manual switching manner to provide a delayed pulse signal 27a. The drive current pulse 29 can be obtained by amplifying in the amplifier 28-2 the delayed timing signal 27a to intermittently amplify the input light signal 5 in the semiconductor light amplifier 21.

As has been described in the foregoing, according to the present invention, a light amplifier driven by current pulses having a stable clock frequency synchronized with the timing of an input light signal serves as an amplifier only when being supplied with the current pulses; therefore, the light output pulses 30 are produced by shaping the light input signal 5 with the drive current pulses 29 of a stable clock frequency, and further, the jitter suppression effect is also produced.

We claim:

1. In combination, a semiconductor light amplifier having an active layer for performing light amplification of input light pulses having peaks applied thereto and developing amplified output light pulses with said peaks amplified, means receptive of the amplified output light pulses and converting them into corresponding electric pulses, detector means for detecting the repetition frequency of peaks in the electric pulses and limiting the amplitude thereof, pulse generating means for receiving the amplitude-limited electric pulses and generating an electric drive pulse train of a stable repetition clock frequency synchronized with the repetition frequency of said peaks and applying the electric drive pulse train to said semiconductor light amplifier for effecting intermittent amplification of the input light pulses applied to the semiconductor light amplifier in synchronism with the pulse repetition frequency of the electric drive pulse train.

2. In the combination according to claim 1, in which said pulse generating means comprises a variable delay circuit for variably delaying said electric pulses received from said detector means.

3. In combination, a semiconductor light amplifier having an active layer for performing light amplification of input light pulses applied thereto and developing amplified output light pulses, means receptive of the amplified output light pulses of the light amplifier for converting the amplified output light pulses into corresponding electric pulses, and including clock pulse generating means receiving the electric pulses for generating an electric drive pulse train of a stable repetition clock frequency synchronized with the repetition clock frequency of said input light pulse train and applying them as a feedback to said semiconductor light amplifier to effect intermittent amplification of said input light pulses in synchronism with and under control of the pulses of the electric drive pulse train.

4. In the combination according to claim 3, in which the clock pulse generating means comprises a variable delay circuit for variably timing said electric drive pulses, thereby to vary the timing of the amplified light output pulses.

5. In the combination according to claim 3, including a beam divider to receive the amplified output light pulses and allow it to pass therethrough and to apply it to the first-mentioned means.

* * * * *